United States Patent
Krishnan et al.

(10) Patent No.: US 11,662,379 B2
(45) Date of Patent: May 30, 2023

(54) METHOD AND SYSTEM OF DETERMINING APPLICATION HEALTH IN AN INFORMATION TECHNOLOGY ENVIRONMENT

(71) Applicant: GAVS Technologies Pvt. Ltd., Chennai (IN)

(72) Inventors: Sivaprakash Krishnan, Chennai (IN); Suresh Kumar Ramasamy, Chennai (IN)

(73) Assignee: GAVS Technologies Pvt. Ltd., Chennai (IN)

( * ) Notice: Subject to any disclaimer, the term of this patent is extended or adjusted under 35 U.S.C. 154(b) by 722 days.

(21) Appl. No.: 15/989,729

(22) Filed: May 25, 2018

(65) Prior Publication Data

US 2019/0041457 A1    Feb. 7, 2019

(51) Int. Cl.
*G06F 11/34* (2006.01)
*G01R 31/317* (2006.01)
*G06F 11/00* (2006.01)

(52) U.S. Cl.
CPC . *G01R 31/31715* (2013.01); *G01R 31/31724* (2013.01); *G06F 11/00* (2013.01)

(58) Field of Classification Search
CPC .................... G01R 31/31715; G01R 31/31724
See application file for complete search history.

(56) References Cited

U.S. PATENT DOCUMENTS

| | | | |
|---|---|---|---|
| 8,090,679 B2 * | 1/2012 | Zhuge | G06F 11/3419 707/603 |
| 8,725,741 B2 | 5/2014 | Cohen et al. | |
| 2003/0204588 A1 * | 10/2003 | Peebles | G06F 11/3495 709/224 |
| 2014/0237453 A1 * | 8/2014 | Hulick, Jr. | G06F 8/70 717/127 |
| 2015/0033084 A1 * | 1/2015 | Sasturkar | G06F 16/24578 714/46 |
| 2015/0288592 A1 * | 10/2015 | Baughman | H04L 47/822 709/224 |
| 2016/0217022 A1 * | 7/2016 | Velipasaoglu | G06F 11/0772 |
| 2017/0046243 A1 | 2/2017 | Shinde et al. | |
| 2017/0091008 A1 | 3/2017 | Cherbakov et al. | |
| 2018/0276063 A1 * | 9/2018 | Mendes | H04L 41/0686 |

* cited by examiner

*Primary Examiner* — Mohamed Charioui
*Assistant Examiner* — Christine Y Liao
(74) *Attorney, Agent, or Firm* — Convergence Intellectual Property Law P.C.; Jonathan Garfinkel

(57) ABSTRACT

A method and a system are disclosed for determining health of a web application. The method includes receiving data for parameters related to exceptions, network anomalies, resource performance, and user experience, associated with devices and servers in the IT environment. A score is determined for the parameters and compared in a multiple-rating scale to obtain parameter ratings for the parameters. A final rating for the exceptions, network anomalies, resource performance, and user experience are determined based on the parameter ratings. The determined final ratings are used for automatically generating an application health index. The application health index provides an accurate and near real-time indication of the health of an application by considering various parameters for each network node in the IT environment.

8 Claims, 7 Drawing Sheets

METHOD AND SYSTEM OF DETERMINING APPLICATION HEALTH IN AN INFORMATION TECHNOLOGY ENVIRONMENT

CROSS-REFERENCES TO RELATED APPLICATIONS

This application claims priority to Indian patent application No. 201841009051, filed on 12 Mar. 2018, the full disclosure of which is incorporated herein by reference.

FIELD OF THE INVENTION

The present invention generally relates to application health management and, in particular, to methods and systems for determining application health in an IT environment.

DESCRIPTION OF THE RELATED ART

Many business organizations may encounter unexpected maintenance issues in information technology (IT) environment that may be fixed in-house or require external support. Traditionally, small and medium sized organizations have used reactive type of support for IT infrastructure maintenance owing to the low costs involved. Reactive IT support help organizations to cut costs by paying for products or services as and when IT support is required. However, reactive IT support may result in loss of revenue, loss of productivity and further may be unable to provide visibility into the entire IT infrastructure of the business. The failure to detect issues at an early stage may result in unforeseen errors either by humans or machines, thereby resulting in unplanned downtimes and outages. On the other hand, many organizations also deploy proactive support, which is based on preventing potential disruptions in the IT environment. Proactive support involves constant monitoring and regular maintenance of various aspects of the IT environment. Such organizations prefer obviating potential server crashes and IT security vulnerabilities by managing application performance.

Assessing the health of applications and analyzing the nature of the errors captured can help anticipate performance issues in future and enhance overall productivity of enterprises. However, managing application health in the IT environment by analyzing exceptional events and network anomalies is a complex challenge in itself. For instance, detection and resolution of exceptional events associated with applications can be contingent upon length of the software, network traffic, uniqueness or repetitiveness of the events, etc. Additionally, analyzing current performance parameters requires high level of accuracy of data associated with the parameters. Further, obtaining application health information is useful only when the performance is analyzed in real time.

Various publications have attempted to address some of the challenges. The US patent publication US20170046243 A1 describes a method for monitoring and measuring application performance in computing devices using an index. Similarly, the U.S. Pat. No. 8,725,741 B2 describes a system and method for application performance monitoring and management. Furthermore, the US patent publication US20170091008 A1 discusses detecting and determining root causes of mobile application faults and performance bottlenecks. However, these publications do not address the challenges of providing an accurate and real time analysis of application health in IT environment.

SUMMARY OF THE INVENTION

The present subject matter relates to application health management in an IT environment.

According to an embodiment of the present subject matter, a computer-implemented method of determining health of a web application in an information technology (IT) environment in near real-time is disclosed. The method includes receiving data related to a plurality of parameters associated with network nodes implementing the web application. The plurality of parameters includes at least one parameter for each category selected from a group of exceptions, network anomalies, resource performance parameters, and user experience. A score associated with the one or more parameters is determined from the received data. The scores represent a measurable value relative to the predefined score of the parameter associated with each network node. A parameter rating is assigned for each of the plurality of parameters by comparing the determined scores in a multiple rating scale. The multiple rating scale includes a plurality of threshold levels for each parameter, which correspond to predetermined range of scores. A final rating is determined for each of the exceptions, network anomalies, resource performance, and user experience from parameter ratings. A score card for the health of the web application is automatically generated at near real-time based on the final rating.

The network nodes may include one or more end user devices, servers, or a combination thereof. The resource performance parameter may include: f) one or more processor performance parameters selected from total processor utilization, total deferred procedure call (DPC) time, total interrupt time, total privileged time, context switches per second, processor queue length per processor, total user time, or total idle time; g) one or more memory performance parameters selected from memory used, free system page table entries (PTE), pages input per second, pages per second, available megabytes of memory, pool paged bytes, pool non-paged bytes; h) one or more disk performance parameters selected from average disk transfer rate, disk read time, current disk queue length, idle time, percentage disk write time, disk reads/sec, disk writes/sec, average disk bytes/read, average disk bytes/transfer, average disk bytes/write, average disk sec/read, average disk sec/write, disk bytes/sec, disk read bytes/sec, disk transfers/sec, disk write bytes/sec, split IO/sec, or percentage disk time; i) one or more database performance parameters selected from buffer cache hit ratio (%), average wait time, page life expectancy in seconds, stolen server memory (%), thread count, processor time (%), total server memory, buffer hit ratio (%), cache hit ratio (%), data dictionary hit ratio (%), FRA usage (%), library cache miss ratio (%); or j) one or more network performance parameters selected from output queue length, network utilization analysis, bytes received/sec, bytes sent/sec, bytes total/sec, packets received/sec, or packets sent/sec, packets/sec.

The score for the exception parameter may be obtained by receiving information related to exceptions encountered at the network nodes; identifying, from exceptions encountered at the network nodes, repetitive network exceptions, unique network exceptions, or both associated with the web application; determining a number for lines of code for the unique exceptions, and a number for transactions for the repetitive exceptions; and determining a ratio of the number to total number to determine the score.

The score for the user experience parameter may be obtained from by receiving response time of one or more end user devices; receiving user inputs for setting threshold response time; comparing the monitored response time with the threshold response time; determining a wow-count and a woe-count based on the comparison, wherein the woe-count indicates number of times the monitored response time exceeds the threshold response time and the wow-count indicates the number of times the monitored response is less than the threshold response time; and determining a ratio for wow-counts to a total count, wherein the total count is the sum of wow-count and woe-count.

The score for the network anomaly parameter may be obtained by identifying one or more network anomalies occurring in the network; receiving number of transactions affected by the one or more network anomalies; and determining a percentage of number of transactions affected by the anomalies to the total number of transactions.

The score for the resource performance parameter may be obtained by receiving data for at least one parameter related to resource performance in the network; and determining score for one or more resource performance parameters, wherein the score is a percentage of the value of the parameter to the total value of the parameter. The score card may be generated by applying a weight factor for each of the final rating for exceptions, the network anomalies, the resource performance, and the user experience index.

According to another embodiment of the present subject matter, a system for determining health of a web application in a network is disclosed. The system includes one or more processing units and a memory unit coupled to the processing units. The memory unit includes a data reception module, a score computation module, one or more ratings module, and an application health module. The data reception module is configured to receive data related to plurality of parameters associated with network nodes implementing the web application. The plurality of parameters includes at least one parameter for each category selected from the group of exceptions, network anomalies, resource performance, and user experience. The score computation module is configured to determine scores associated with the one or more parameters. The score represents a measurable value relative to a predefined score of the parameter associated each network node. The one or more ratings module is configured to assign a rating for each of the plurality of parameters by comparing determined scores in a multiple rating scale. The multiple rating scale includes a plurality of threshold levels for each parameter, where the threshold levels corresponding to predetermined range of scores. The one or more rating module is further configured to: determine a final rating for each of the exceptions, network anomalies, resource performance, and user experience from parameter ratings. The application health module is configured to automatically generate a score card for the health of the web application at near real-time based on the final ratings.

The one or more devices may include one or more of web servers, application servers, database servers, and databases. The system may include a network interface configured to enable communication with the one or more devices over the network. The system may further include a user interface to enable a user to interact with the system. The system may be used for determining the health of a plurality of web applications.

This and other aspects are disclosed herein.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE EMBODIMENTS

Figure 1:
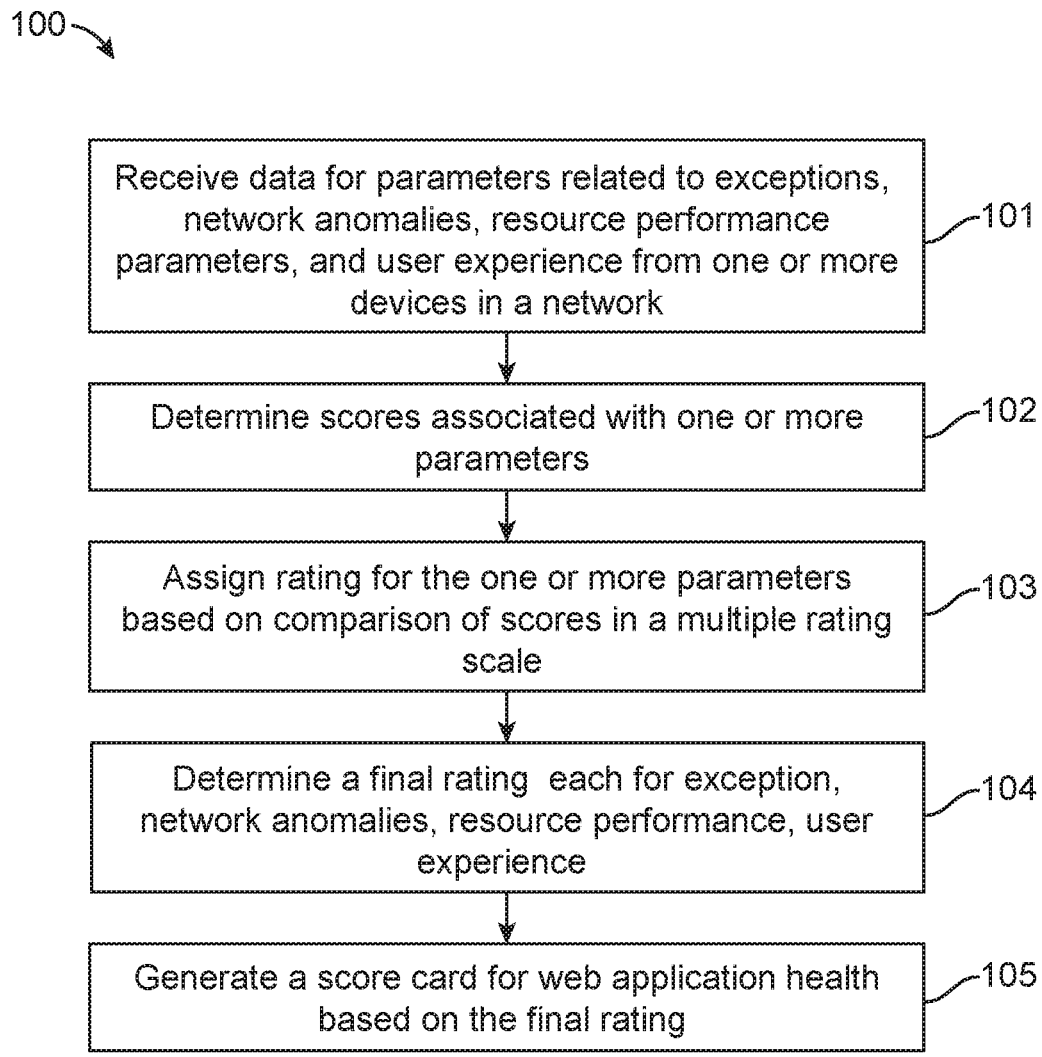
FIG. 1 illustrates a method of determining health of an application in an information technology environment, according to an embodiment of the present subject matter.

While the invention has been disclosed with reference to certain embodiments, it will be understood by those skilled in the art that various changes may be made and equivalents may be substituted without departing from the scope of the invention. In addition, many modifications may be made to adapt to a particular situation or material to the teachings of the invention without departing from its scope.

Throughout the specification and claims, the following terms take the meanings explicitly associated herein unless the context clearly dictates otherwise. The meaning of "a", "an", and "the" include plural references. The meaning of "in" includes "in" and "on." Referring to the drawings, like numbers indicate like parts throughout the views. Additionally, a reference to the singular includes a reference to the plural unless otherwise stated or inconsistent with the disclosure herein.

A method, a system and a computer program product for determining health of a web application in an Information Technology (IT) environment are disclosed. The method, system and computer program product provide accurate and near real-time score card indicative of the health of the web application. Upon receiving parameter data related to exceptions, network anomalies, resource performance, and user experience, associated with devices and servers in the IT environment, the system determines a score for the parameters. The determined scores are used to assign a rating for each parameter in a multiple scale rating system and obtain a final rating based on which a score card for the application health, Application Health Index (AHI), is generated. The AHI provides an accurate indication of the health of an application by considering various parameters for each node in the IT environment.

In some embodiments, a method 100 of determining health of at least one web application in an IT environment is provided as illustrated in FIG. 1. The method 100 includes receiving data related to one or more parameters associated with network nodes at block 101. The parameters may be related to exceptions, network anomalies, resource performance, and user experience of the one or more network nodes. The network nodes may include a plurality of end user devices and/or servers in the IT environment. Examples of parameters may include one or more of number of lines of code, number of transactions, response time, CPU utilization, total privileged time, etc.

A score associated with each parameter is determined based on the received data, at block 102. The score may represent a measurable value relative to a predefined value of the parameter. For example, the measurable value may be a numeral, ratio, percentage, rate, etc., that indicates the magnitude of the parameter. The predefined value may be any value set by an administrator, such as an optimal or desired value of the parameter, total value of the parameter, service level agreement-defined (SLA) parameter value, etc. For example, to determine the score of number of transactions involved during a period of an exceptional event, if the received data for the number of transactions is 11 and the total number of transactions during that period is 100, then the score of number of transactions may be 11%. A parameter rating is assigned for each parameter by comparing the determined scores in a multiple-rating scale at block 103. The multiple-rating scale includes a plurality of threshold levels, which correspond to a predetermined range of scores. For example, the parameter rating may be "1" until a first threshold level on the multi-rating scale, "2" from first threshold level to second threshold level, "3" from second threshold level to fourth threshold level, "4" from fourth threshold level to fifth, "5" from fifth threshold to sixth, and so on.

Based on the parameter ratings, a final rating for each category of exceptions, network anomalies, resource performance, and user experience is determined at block 104. The final rating may be an aggregate of all the parameter ratings. Finally, a score card is automatically generated at near real-time based on the final ratings for each of exceptions, network anomalies, resource performance, and user experience at block 105. The scorecard is periodically determined and/or monitored by the system. The score card or AHI indicates a balanced and accurate estimation of the health of the application implemented in the network.

Figure 2:
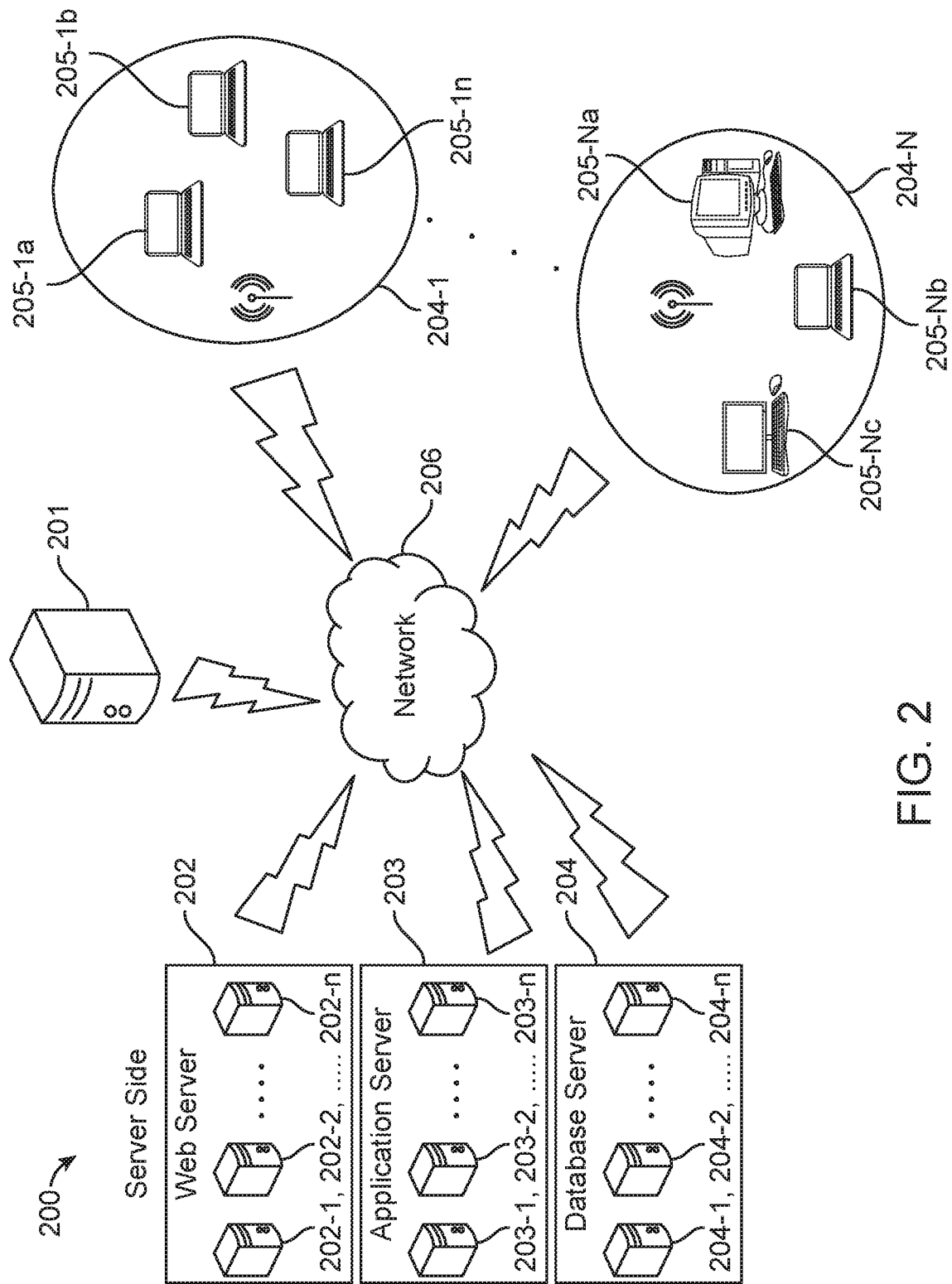
FIG. 2 illustrates a network architecture according to an embodiment of the present subject matter.

According to one embodiment, a network architecture 200 comprising a system 201 for determining application health is illustrated in FIG. 2. The architecture may include the system 201, one or more servers 202, 203, 204, one or more local networks 204-1-204-N comprising end user devices 205, all of which may be connected over the network 206. The one or more servers 202, 203, 204 may render essential services required in IT environments and may include: web servers 202-1-202-N for delivering content or services to end users through the network 206, application servers 203-1-203-N to facilitate installation, operation, hosting of applications, and database servers 204-1-204-N to run database applications.

The architecture may include one or more local networks 204-1, 204-2 . . . 204-N. Each local network may not necessarily be located in the same geographical location, for example, 204-1 may be a network in a workplace and 204-N may be a network in an educational institution. In one example, the end user devices 205-1, 205-2 . . . 205-N may or may not be associated with the local networks. In one example, the local networks 204-1, 204-2 . . . 204-N may use the services rendered by the one or more servers 202, 203, 204.

The end user devices 205-1, 205-2 . . . 205-N may include laptop computers, tablet computers, desktop computers, smartphones, personal digital assistants (PDA), smart devices, or the like. In some embodiments, the devices may be configured to utilize various communication protocols, such as Global System for Mobile Communications (GSM), General Packet Radio Services (GPRS), Enhanced Data GSM Environment (EDGE), Code Division Multiple Access (CDMA), Wideband Code Division Multiple Access (WCDMA), Bluetooth, High Speed Packet Access (HSPA), Long Term Evolution (LTE), 5G, 5G-New Radio, and Worldwide Interoperability for Microwave Access (WiMAX).

Figure 3:
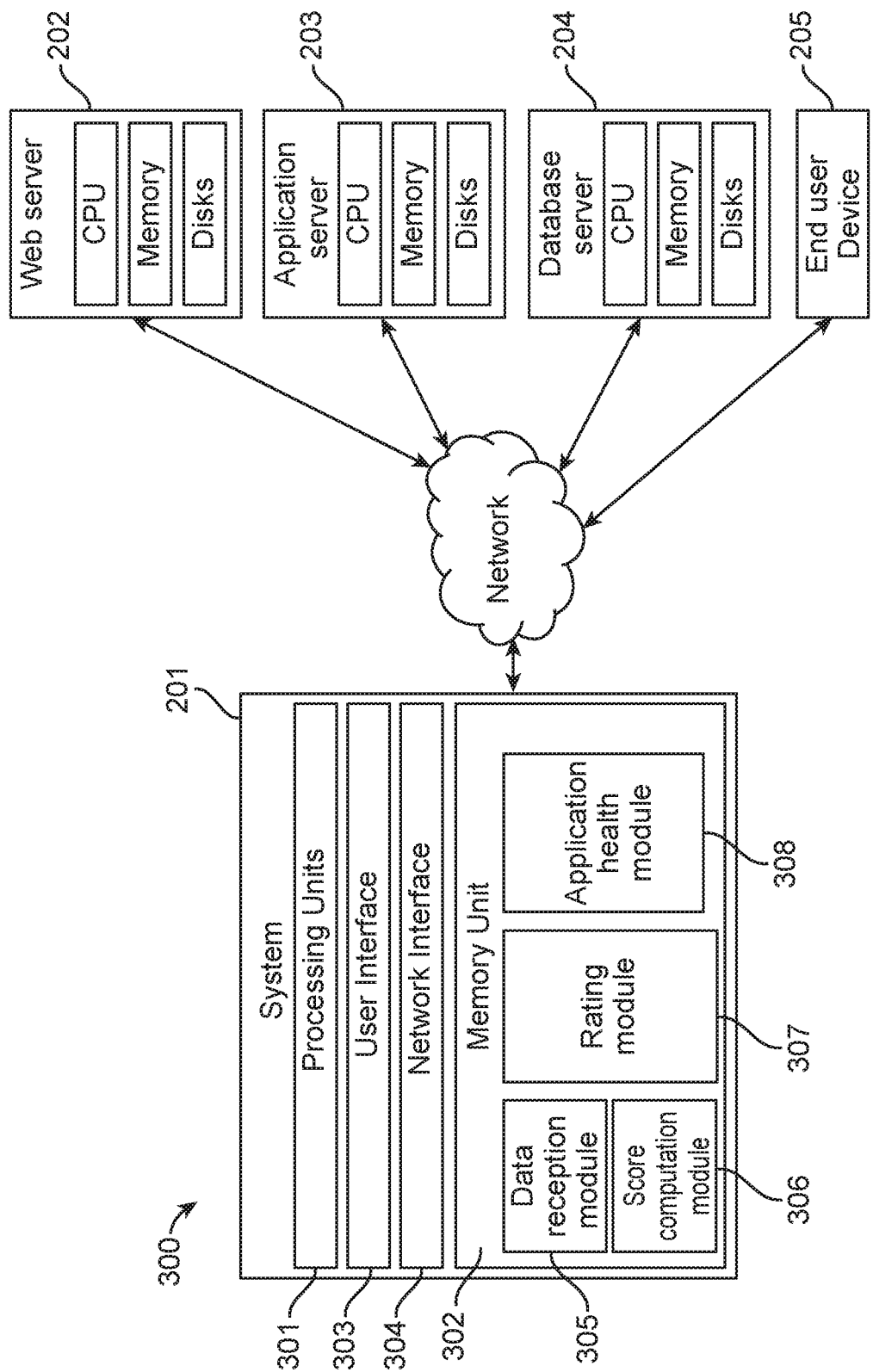
FIG. 3 illustrates a system for determining health of an application, according to an embodiment of the present subject matter.

According to one embodiment, a system 201 for determining web application health is illustrated in FIG. 3. The system 201 primarily includes one or more processing units 301, a memory unit 302, a user interface 303, and a network interface 304. The network interface 304 enables the system to communicate with one or more devices. The one or more devices may be an end user device 205, one or more servers, such as webs server 202, application server 203, database servers 204. The user interface 303 enables a person, such as an IT administrator or an operator, to interact with the system. The memory unit 302 may include a data reception module 305, score computation module 306, one or more ratings module 307, and an application health module 308. Each of the modules 305, 306, 307, 308 may be implemented as software code to be executed by the one or more processing units 301 using any suitable computer language. The software code may be stored as a series of instructions or commands in the memory unit 302.

The data reception module 305 may be configured to receive data related to one or more parameters associated with the network nodes. The parameters in some embodiments may be related to at least one of exceptions, network anomalies, resource performance, and user experience, associated with a plurality of end user devices or servers, or both. In some embodiments, parameters related to exceptions or anomalies may include one or more of number of lines of code and number of transactions on end user side or server side. Similarly, the parameters related to resource performance may include performance parameters of components like CPU, memory, disk, network, etc. The parameters may be received from the end user devices and one or more servers, such as web server 202, application server 203, and database server 204. Alternatively, in some embodiments, the parameters may be temporarily stored in an independent data store or database, which can be accessed by the system in real-time.

The data reception module 305 may communicate with a plurality of agents (not shown in FIG. 3) for collecting data related to the parameters from the one or more end users and servers. The plurality of agents may be computer programs, such as bots, which may work in a specific device or network. The agents may reside in the system and may be invoked to perform specific tasks, such as collecting and reporting data related to the parameters. In some embodiments, the parameters may be monitored at the end user devices and servers by service desk tools and service monitoring tools, respectively. The service desk tools and service monitoring tools may be installed at each end user device and server. The agents may communicate with the service desk tools and the service monitoring tools to collect the monitored data. In some embodiments, the agent is deployed in the application's web server. In some embodiments, the agent is configured to monitor traffic that goes in and out of the web server to derive the parametric data. In some embodiments, the agent deployed in the webserver captures the performance parameters related to webserver and/or infrastructure associated with the system. In some embodiments, an alert is generated based on availability or health of the application based on the inputs from the agent. In some embodiments, the infrastructure includes server, CPU, memory, disk, and local network. Further, the agents may be autonomous and not require user interaction to perform the tasks for the data reception module.

The score computation module 306 may be configured to determine the score associated with the one or more parameters. The score may be a numerical value indicative of the measurements of an associated parameter. For example, data for number of lines of code (parameter) associated with an application affected due to a unique exception may be 14 and the total number of lines of code may be 700. The score may be computed as a percentage of the number of lines of code affected to the total number of lines of code in the application. i.e., 2%. Similarly, the received data for response time (a parameter of user experience), may be 10 ms. Based on this a user experience index (score) associated with user experience may be determined.

The one or more ratings modules 307 may be configured to compare the scores and assign a rating on a multiple-rating scale. The multiple-rating scale includes a plurality of threshold levels corresponding to predetermined range of values for each level. Based on the scores, the corresponding threshold levels may be identified. The ratings module determines a parameter rating for the one or more parameters based on the comparison performed by the comparison module. Further, the one or more ratings module 307 is configured to determine a final rating for each of the exceptions, the network anomalies, the resource performance parameters, and a user experience index (UEI).

Finally, the application health module 308 is configured to automatically generate a score card at near real-time representing the AHI from the final rating. In one embodiment, the application health index may be generated by applying a weight factor for each of the exception rating, the network rating, the resource performance rating, and the user experience index.

Figure 4:
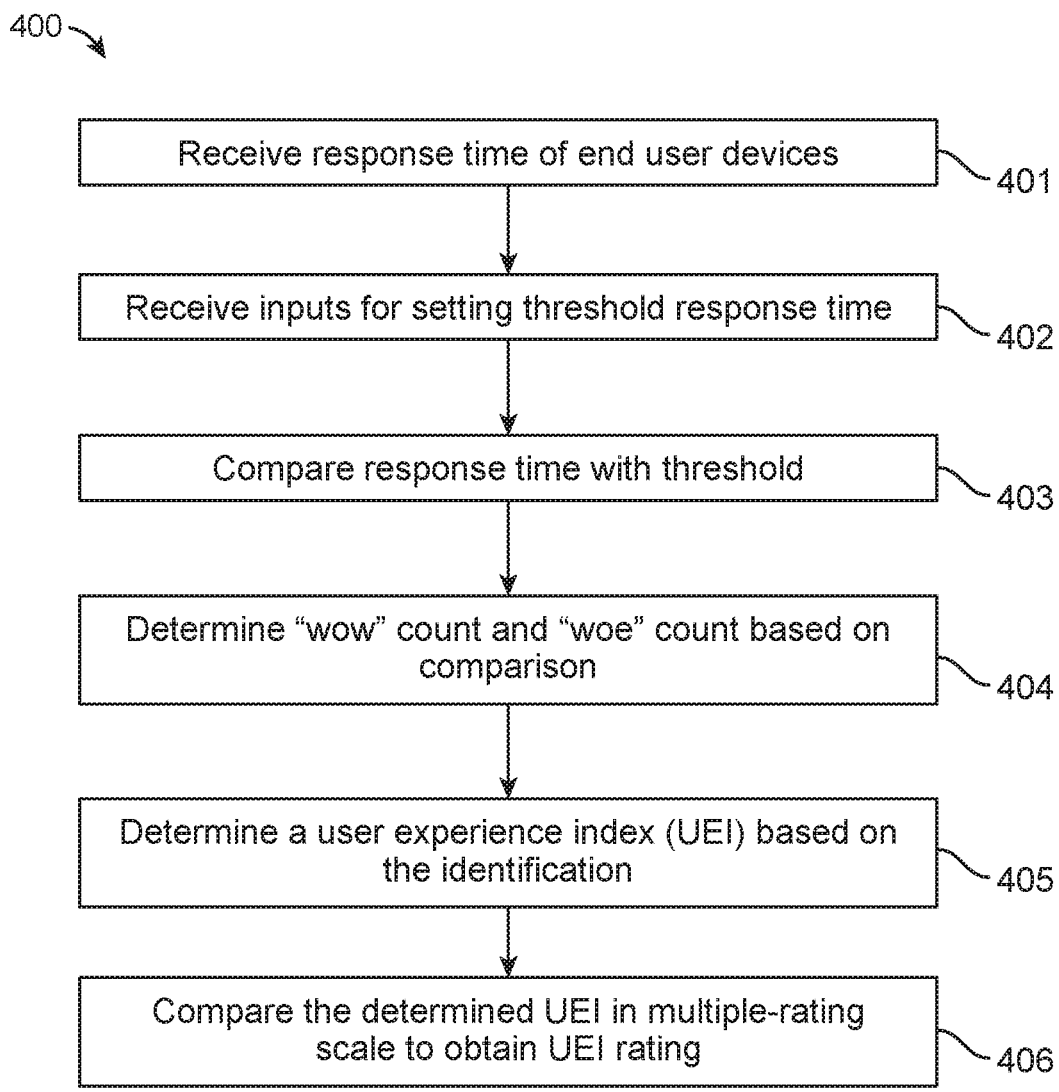
FIG. 4 illustrates a method for determining user experience index, according to an embodiment of the present subject matter.

According to one embodiment, a method 400 for determining user experience index is illustrated in FIG. 4. The method includes receiving response time of end user devices at block 401. The receiving may be performed by the plurality of agents as described earlier. The response time may refer to turnaround time, i.e., the elapsed time between an inquiry on a system and the response to that inquiry. The response time includes the time from the moment a request is initiated at the end user device, the processing time at the one or more servers, and the time taken to render the response to the request.

Inputs for setting a threshold response time are received at block 402. The threshold response time may be received from the administrator through the user interface of the system 201. The received response time may be compared to the threshold response time at block 403. Based on the comparison, the number of wow-counts and woe-counts may be determined, at block 404. The wow-count and the woe-count may refer to the number of times the response time is less than the threshold response time and the number of times the response time is more than the threshold response time. For example, if the received data for response time for an end user device at 17:00 hours is 40 ms and the received threshold response time is 35 ms, then it would lead to a woe-count. Similarly, at 18:00 hours if the response time of the end user device is 30 ms, then it would lead to a wow-count. The user experience index is calculated based on the wow-counts and woe-counts at block 405. In one embodiment, the user experience index may be determined based on the ratio of the "wow count" to the total request count. The total request count may be given as sum of "wow count" and "woe count". Further, the determined user experience index is compared in the multiple-rating scale to determine a final rating of the user experience index, at block 406.

Figure 5:
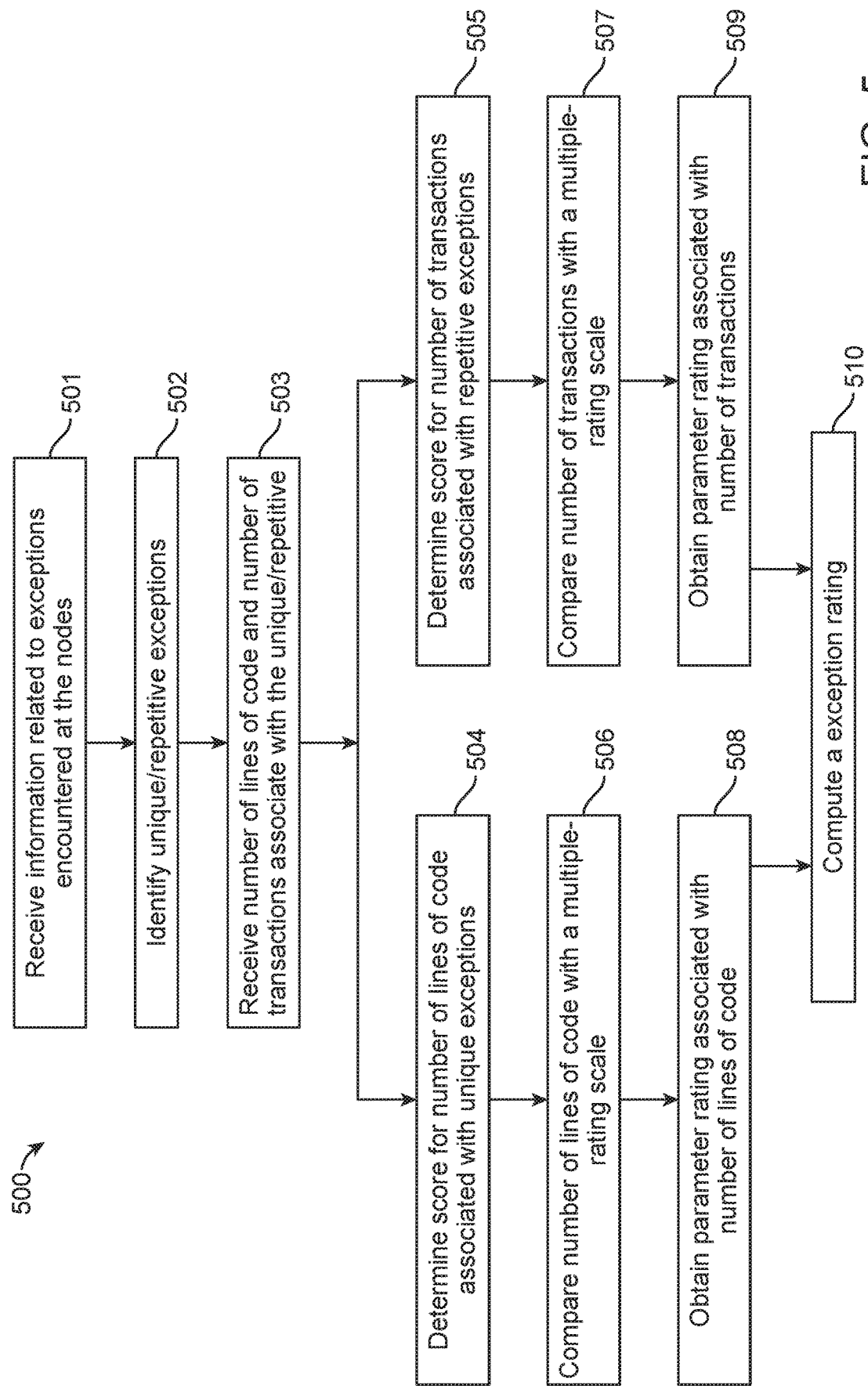
FIG. 5 illustrates a method for determining exception rating, according to an embodiment of the present subject matter

According to one embodiment, a method 500 for determining exception rating is illustrated in FIG. 5. The method 500 includes receiving information related to exceptions encountered at the end user devices and each server, at block 501. The received information, which may include a history of exceptional events in the network, may be collected by plurality of agents and then may be stored in the memory or a database of the system 201. Further, the method includes identifying, from the received information, repetitive and unique network exceptions associated with the application at block 502. The identified unique and repetitive exceptions may be used for estimating the number and types of solutions required to mitigate future exceptional events. In some embodiments exceptions may be repetitive and may be accounted for in a similar manner. In other embodiments, each unique exception may be mitigated by unique solutions. Therefore, the number of solutions required to prevent the exceptions may be far lesser than the total number of exceptions. For each identified exception, the number of lines of code and number of transactions are received at block 503. These parameters may be received by the plurality of agents that communicate with the data reception module and monitoring and desk tools. Scores are determined for the number of lines of code associated with unique exceptions and for the number of transactions associated with the repetitive exceptions at blocks 504 and 505, respectively. The determined scores for number of lines of code are compared in the multiple-rating scale, which includes multiple threshold levels for different values of number of lines of code corresponding to each level, at block 506. Similarly, the determined scores for number of transactions are compared in the multiple-rating scale, which includes multiple threshold levels for different ranges of number of transactions corresponding to each level, at block 507. Based on the comparisons, parameter ratings for the number of lines of code and the number of transactions associated with the exceptions are obtained at block 508 and at block 509, respectively. A final exception rating is computed based on the parameter ratings at block 510. In some embodiments, a weightage may be applied in the final exception rating or the parameter ratings based on the uniqueness and repetitiveness of exceptions as identified in block 502. For instance, the weightage may be directly proportional to the uniqueness of the exception. In some embodiments a higher weightage may be applied to the unique exceptions and lower weightage may be applied to the repetitive exceptions.

Figure 6:
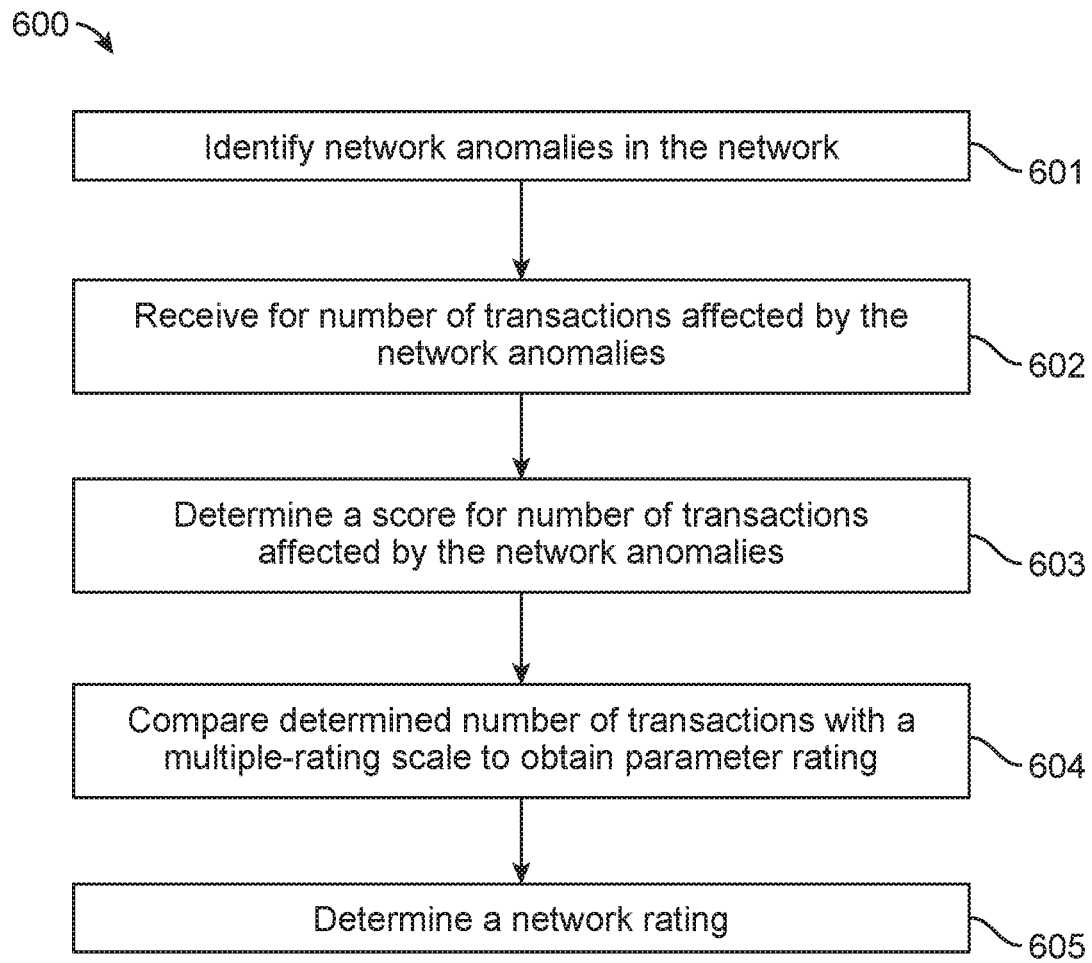
FIG. 6 illustrates a method for determining network rating, according to an embodiment of the present subject matter.

According to one embodiment, a method for determining a network rating is illustrated in FIG. 6. The method 600 includes identifying anomalies in the network at block 601. The number of transactions affected by the network anomalies is received at block 602. Further, a score for the number of transactions affected by the transactions is determined at block 603. The determined score is compared in a multiple-rating scale at block 604. Based on the comparison, a network rating is determined at block 605.

Figure 7:
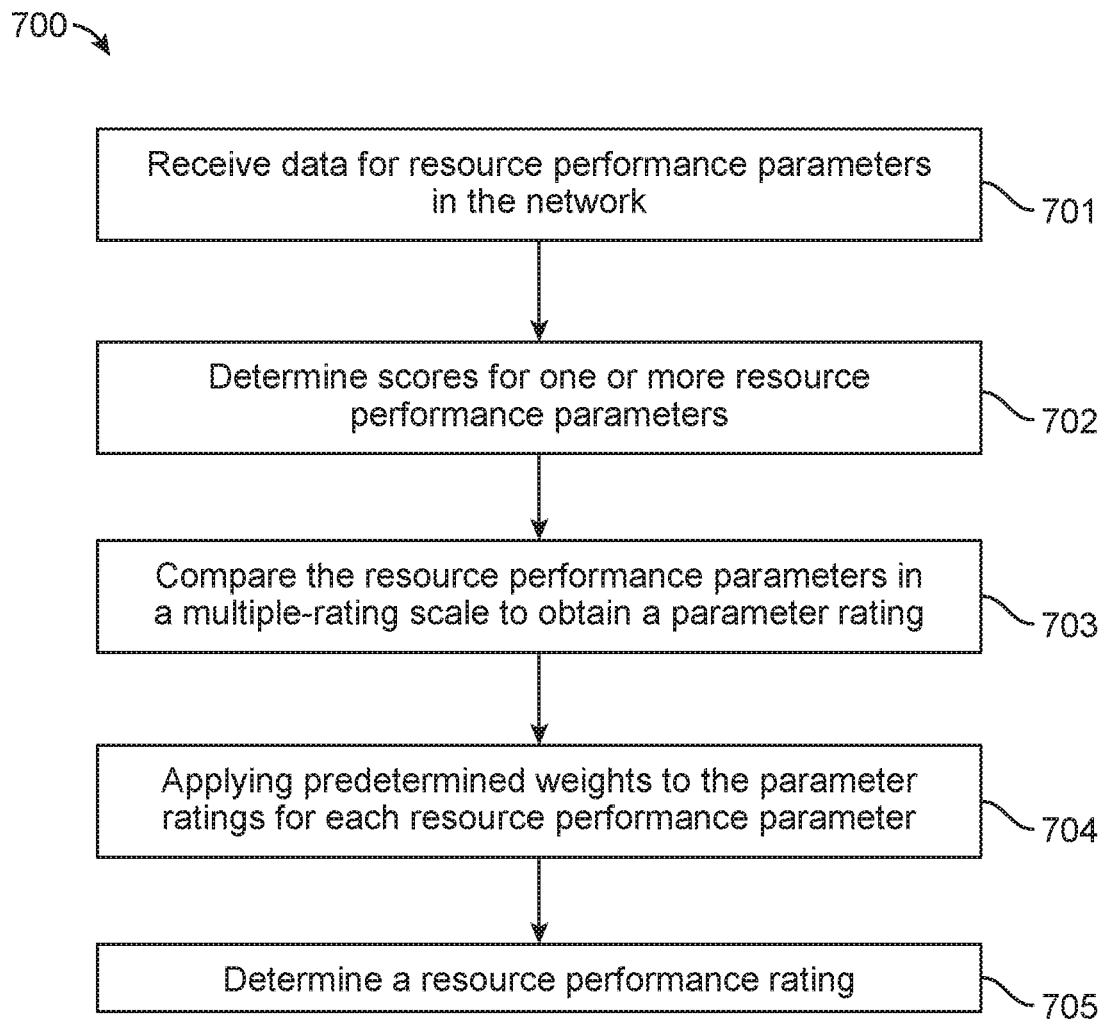
FIG. 7 illustrates a method for determining resource performance rating, according to an embodiment of the present subject matter.

According to one embodiment, a method 700 for determining resource performance rating is illustrated in FIG. 7. The method includes receiving data for resource performance parameters in the network at block 701. The performance parameters of CPU, memory, disk, and network are received through the agents. The performance parameters of CPU may in some embodiments include total processor utilization, total deferred procedure call (DPC) time, total interrupt time, total privileged time, context switches per second, processor queue length per processor, total user time, or total idle time. The performance parameters of memory may include memory used, free system page table entries (PTE), pages input per second, pages per second, available megabytes of memory, pool paged bytes, or pool non-paged bytes. The performance parameters for disk may in some embodiments include average disk transfer rate, disk read time, current disk queue length, idle time, percentage disk write time, disk reads/sec, disk writes/sec, average disk bytes/read, average disk bytes/transfer, average disk bytes/write, average disk sec/read, average disk sec/write, disk bytes/sec, disk read bytes/sec, disk transfers/sec, disk write bytes/sec, split IO/sec, or percentage disk time. The performance parameters of the network may in some embodiments include output queue length, network utilization analysis, bytes received/sec, bytes sent/sec, bytes total/sec, packets received/sec, packets sent/sec, packets/sec, etc. In some embodiments the application may be a database application and in step 701 the method 700 may include evaluating one or more performance parameters selected from buffer cache hit ratio (%), average wait time, page life expectancy in seconds, stolen server memory (%), thread count, % processor time, total server memory, buffer hit ratio (%), cache hit ratio (%), data dictionary hit ratio (%), FRA usage (%), or library cache miss ratio (%). A score is determined for one or more of the above parameters at block 702. Each of the performance parameters may be compared in a multiple-rating scale to obtain parameter rating at block 703. After the comparison, predetermined weights may be applied to the parameter ratings for each of the performance parameters at block 704. Based on the predetermined weights, a final resource performance rating is determined at block 705.

The above subject matter and its embodiments provide assessment of the health of applications that can help anticipate performance issues in future and enhance overall productivity of enterprises. The application health index provides an accurate indication of the application health as it incorporates an exhaustive set of parameters that could affect application performance. The multiple-rating scale as described in the invention provides multiple threshold levels to distinguish parameters and events that are more serious to the health of an application. Further, the present subject matter also involves computation of application health index in real-time or near real-time by, for example, directly identifying unique and repetitive exceptions.

Although the detailed description contains many specifics, these should not be construed as limiting the scope of the invention but merely as illustrating different examples and aspects of the invention. It should be appreciated that the scope of the invention includes other embodiments not discussed herein. Various other modifications, changes and variations which will be apparent to those skilled in the art may be made in the arrangement, operation and details of the system and method of the present invention disclosed herein without departing from the spirit and scope of the invention as described here.

While the invention has been disclosed with reference to certain embodiments, it will be understood by those skilled in the art that various changes may be made and equivalents may be substituted without departing from the scope of the invention. In addition, many modifications may be made to adapt to a particular situation or material the teachings of the invention without departing from its scope as defined by the appended claims.

EXAMPLES

Example 1

The description given below explains the details of the multi-rating scale used for determining the application health index, according to an example of the present subject matter.

As shown below, Table 1 illustrates the various components of the user experience, exceptions, network anomalies, and resource performance. An example predetermined weightage has been assigned to each of the user experience, exceptions, network anomalies, and resource performance. It may be noted that the weightage can be adjusted by the administrator as desired.

TABLE 1

Components Considered in User Experience, Exceptions, Anomalies and Resource Performance

| # | Category | Components | Weights | |
|---|---|---|---|---|
| 1 | UX | User Experience Index | 20% | i, 20% |
| 2 | Exceptions | Unique - Server Side | 5% | j, 20% |
| 3 | | Repetitive - Server Side | 5% | |
| 4 | | Unique - Client Side | 5% | |
| 5 | | Repetitive - Client Side | 5% | |
| 6 | Anomalies | Network errors | 15% | k, 15% |
| 7 | Performance | CPU | 10% | l, 45% |
| 8 | | Memory | 10% | |
| 9 | | Disk | 5% | |
| 10 | | Network | 10% | |
| 11 | | Database | 10% | |

As shown below, Table 2 illustrates the multi-rating scale for various parameters for determining final ratings for user experience, exceptions, and network anomalies. For user experience, the ratio of wow count to the total request count is used. The wow count and woe count may in itself be determined based on the response time parameter. The various parameters for exceptions include number of lines of code and number of transactions. The parameters related to the exceptions include number of lines of code associated with unique and repetitive exceptions and the number of transactions associated with unique and repetitive exceptions. As the system receives the number of lines of code and the number of transactions, a score indicating the percentage number of lines of code and percentage number of transactions are determined. Similarly, a score representing percentage number of transactions associated with network anomalies is determined.

TABLE 2

Multiple-Rating Scale for User Experience, Exceptions, and Anomalies

| | | | Rating Scale | | | |
|---|---|---|---|---|---|---|---|
| # | Category | Parameter | 5 excellent | 4 very good | 3 satisfactory | 2 must improve | 1 unacceptable |
| 1 | UX | wow count/total count | >98% | 85% to 98% | 70% to 85% | 50% to 70% | <50% |
| 2 | Exceptions | % of number of Lines of Code (Unique - Server Side) | <1% | 1% to 2% | 2% to 3% | 3% to 4% | >4% |
| 3 | | % of number of transactions (Repetitive - Server Side) | <1% | 1% to 3% | 3% to 5% | 5% to 10% | >10% |
| 4 | | % of number of Lines of Code (Unique - Client Side) | <1% | 1% to 2% | 2% to 3% | 3% to 4% | >4% |
| 5 | | % of number of transactions (Repetitive - Client Side) | <1% | 1% to 3% | 3% to 5% | 5% to 10% | >10% |
| 6 | Anomalies | % of number of transactions | <1% | 1% to 2% | 2% to 3% | 3% to 4% | >4% |

The determined scores are compared in the multiple-rating scale. As shown, the multiple-rating scale includes five threshold levels, each of which corresponds to a predetermined range of scores. Based on this a parameter rating—1 (unacceptable), 2 (must improve), 3 (satisfactory), 4 (very good), 5 (excellent) is determined. The parameter ratings are then used for computation of the final rating for each of the user experience, exceptions, and anomalies. Each of the parameter ratings is then aggregated to determine the final rating for the user experience, exceptions, and network anomalies.

Further, Table 3A illustrates a multiple-rating scale for the resource performance parameters and database parameters. The various parameters for the performance of CPU, Memory, Disk, network, and database (SQL and Oracle) are listed. The parameters for CPU include total CPU utilization, total DPC time, total interrupt time, total privileged time, context switches/sec, and processor queue length per processor, total user time, or total idle time. Similarly, respective parameters for memory, disk, network, and database, as shown in Table 3A, are received by the system. A score for each of the parameters is determined based on the received parameters. The scores are compared on the multiple-rating scale to obtain a parameter rating for each parameter. An example of the range of scores for each parameter is illustrated in Table 3A (the range of scores for some of the performance parameters are not illustrated, however, it may be understood that the range of scores and the weightage for each parameter can be set or adjusted at the discretion of the administrator). The parameter ratings are then aggregated based on the weightage to determine a final rating for the resource performance parameters.

TABLE 3A

Multiple-Rating Scale for Resource Performance Parameters

| | | | | Rating Scale | | | | |
|---|---|---|---|---|---|---|---|---|
| # | Component | Performance Parameters | Weights | 5 excellent | 4 very good | 3 satisfactory | 2 must improve | 1 unacceptable |
| 7 | CPU | *Total CPU Utilization % | 40% | <20% | 20% to 40% | 40% to 60% | 60% to 90% | >90% |
| | | *Total DPC Time % | 10% | <10% | 10% to 20% | 20% to 40% | 40% to 95% | >95% |
| | | *Total Interrupt Time % | 10% | <10% | 10% to 20% | 20% to 40% | 40% to 95% | >95% |
| | | Total Privileged Time % | 10% | <10% | 10% to 20% | 20% to 40% | 40% to 75% | >75% |
| | | Context Switches/sec | 10% | <1000 | 1000 to 2000 | 2000 to 5000 | 5000 to 15000 | >15000 |

TABLE 3A-continued

Multiple-Rating Scale for Resource Performance Parameters

| # | Component | Performance Parameters | Weights | Rating Scale | | | | |
|---|---|---|---|---|---|---|---|---|
| | | | | 5 excellent | 4 very good | 3 satisfactory | 2 must improve | 1 unacceptable |
| | | Processor Queue Length per processor | 10% | 0 | 0 | 0 | 1 | 2 and above |
| | | Total user time | 5% | — | — | — | — | — |
| | | Total idle time | 5% | — | — | — | — | — |
| 8 | Memory | Memory Used % | 25% | <20% | 20% to 40% | 40% to 60% | 60% to 90% | >90% |
| | | Free System Page Table Entries (PTE) | 20% | >15000 | 15000 to 13000 | 13000 to 10000 | 10000 to 5000 | <5000 |
| | | Pages Input/sec | 10% | <2 | 2 to 6 | 6 to 8 | 8 to 10 | >10 |
| | | Pages/sec | 10% | <500 | 500 to 1000 | 1000 to 2500 | 2500 to 5000 | >5000 |
| | | Available Megabytes of Memory | 25% | — | — | — | — | — |
| | | Pool Paged Bytes | 5% | — | — | — | — | — |
| | | Pool Non-Paged Bytes | 5% | — | — | — | — | — |
| 9 | Disk (logical/physical) | Avg. Disk sec/Transfer (Physical Disk) | 10% | <1 ms | 1 ms to 2 ms | 2 ms to 3 ms | 3 ms to 4 ms | >4 ms |
| | | Disk Read Time % (Physical Disk) | 10% | <20% | 20% to 30% | 30% to 40% | 40% to 60% | >60% |
| | | Current Disk Queue Length (Physical Disk) | 5% | 0 | 0 | 0 | 1 | 2 |
| | | Idle Time % | 5% | >85% | 60% to 85% | 40% to 60% | 20% to 40% | <20% |
| | | Disk Write Time % | 5% | — | — | — | — | — |
| | | Disk Reads/Sec | 5% | — | — | — | — | — |
| | | Disk Writes/Sec | 5% | — | — | — | — | — |
| | | Avg. Disk Bytes/Read | 5% | — | — | — | — | — |
| | | Avg. Disk Bytes/Transfer | 5% | — | — | — | — | — |
| | | Avg. Disk Bytes/Write | 5% | — | — | — | — | — |
| | | Avg. Disk sec/Read | 5% | — | — | — | — | — |
| | | Avg. Disk sec/Write | 5% | — | — | — | — | — |
| | | Disk Bytes/sec | 5% | — | — | — | — | — |
| | | Disk Read Bytes/sec | 5% | — | — | — | — | — |
| | | Disk Transfers/sec | 5% | — | — | — | — | — |
| | | Disk Write Bytes/sec | 5% | — | — | — | — | — |
| | | Split IO/Sec | 5% | — | — | — | — | — |
| | | Disk Time % | 5% | — | — | — | — | — |
| 10 | Network | Output Queue Length | 10% | 0 | 0 | 0 | 1 | 2 and above |
| | | Network Utilization Analysis | 60% | <10% | 10% to 30% | 30% to 50% | 50% to 80% | >80% |
| | | Bytes Received/Sec | 5% | — | — | — | — | — |
| | | Bytes Sent/Sec | 5% | — | — | — | — | — |

TABLE 3A-continued

Multiple-Rating Scale for Resource Performance Parameters

| # | Component | Performance Parameters | Weights | 5 excellent | 4 very good | 3 satisfactory | 2 must improve | 1 unacceptable |
|---|---|---|---|---|---|---|---|---|
| | | Bytes Total/Sec | 5% | — | — | — | — | — |
| | | Packets Received/Sec | 5% | — | — | — | — | — |
| | | Packets Sent/Sec | 5% | — | — | — | — | — |
| | | Packets/Sec | 5% | — | — | — | — | — |

Table 3B illustrates multiple-rating scale for the database parameters. The parameters for SQL database and Oracle database are provided. The system determines scores for each of the parameters based on the type of database. The determined scores are compared on the multiple-rating scale to determine the parameter rating. An example of the range of scores for each parameter for SQL and Oracle databases are illustrated in Table 3B (the range of scores for some of the performance parameters are not illustrated, however, it may be understood that the range of scores and the weightage for each parameter can be set or adjusted at the discretion of the administrator). The parameter ratings are then aggregated based on the weights to obtain final ratings for the database.

The final ratings for the user experience, exceptions, network anomalies, and the resource performance are then used for generating the application health index. A predetermined weightage is applied to each final rating. The predetermined weightage as shown in Table 1 indicates that user experience has 20% weightage, exceptions have 20% weightage, anomalies have 15% weightage, and resource parameters has 45% weightage. The weightage and the final ratings for the user experience, exceptions, network anomalies, and the resource performance are combined to generate the application health index.

According to the present example, the Application health index is computed as follows:

$$AHI=[i(a)+j(b)+k(c)+l(d)]/(i+j+k+l)$$

TABLE 3B

Multiple-Rating Scale for Database Parameters

| # | Component | Performance Parameters | Weights | 5 excellent | 4 very good | 3 satisfactory | 2 must improve | 1 unacceptable |
|---|---|---|---|---|---|---|---|---|
| 11a | **Database (SQL) | Buffer Cache Hit Ratio (%) | 15% | >95% | 95% to 70% | 70% to 40% | 40% to 10% | <10% |
| | | Average Wait Time | 15% | up to 25 ms | 25 ms to 50 ms | 50 ms to 100 ms | 100 ms to 250 ms | >250 ms |
| | | Page Life Expectancy in seconds | 10% | >1000 | 1000 to 800 | 800 to 500 | 500 to 300 | <300 |
| | | Stolen server Memory (%) | 20% | up to 10% | 10% to 20% | 20% to 40% | 40% to 75% | >75% |
| | | Thread Count | 10% | — | — | — | — | — |
| | | % Processor Time | 20% | — | — | — | — | — |
| | | Total Server Memory | 10% | — | — | — | — | — |
| 11b | **Database (Oracle) | Buffer Hit Ratio (%) | 20% | >85% | 85% to 80% | 80% to 75% | 75% to 70% | <70% |
| | | Cache Hit Ratio (%) | 20% | >85% | 85% to 80% | 80% to 75% | 75% to 70% | <70% |
| | | Data Dictionary Hit Ratio (%) | 20% | >95% | 95% to 90% | 90% to 85% | 85% to 80% | <80% |
| | | FRA Usage (%) | 20% | up to 50% | 50% to 60% | 60% to 70% | 70% to 85% | >85% |
| | | Library Cache Miss Ratio (%) | 20% | 0% to 0.7% | 0.7% to 0.8% | 0.8% to 0.9% | 0.9% to 1% | >1% |

*The percentage figure is averaged for 5 samples for a total duration of 5 minutes due to their dynamic nature i.e. a sample per minute
**Either 11a or 11b is considered depending upon the Database type.
Rating range has not been given to some of the counters and marked as '—' in this example.

where i, j, k and l are the weights given to User Experience Index (a), Client exceptions and Server exceptions (b), Network anomalies (c), and Infrastructure Performance (d), respectively.

What is claimed is:

1. A computer-implemented method of determining near real-time health of a web application, comprising the steps of:
   a. receiving data relating to a plurality of parameters associated with network nodes implementing the web application, the plurality of parameters comprising at least one parameter for each of exceptions, network anomalies, resource performance, and user experience;
   b. determining a score for one or more parameters from the received data, wherein the score represents a measurable value relative to a predefined score of the parameter associated with each network node;
   c. assigning a parameter rating for each of the plurality of parameters by comparing determined scores in a multiple rating scale, wherein the multiple rating scale comprises a plurality of threshold levels for each parameter, the threshold levels corresponding to pre-determined range of scores;
   d. determining a final rating for each of the exceptions, network anomalies, resource performance, and user experience from parameter ratings; and
   e. automatically generating a score card for the health of the web application based on the final rating, wherein generating the score card comprises applying a weight factor for each of the final rating for exceptions, the network anomalies, the resource performance, and the user experience index; and wherein the determined score for the at least one exception parameter is obtained from the steps of:
      receiving information related to exceptions encountered at the network nodes;
      identifying, from exceptions encountered at the network nodes, repetitive network exceptions, unique network exceptions, or both associated with the web application;
      determining a number for lines of code for the unique exceptions, and a number for transactions for the repetitive exceptions; and
      determining a ratio of the determined number to total number to obtain the score;
   wherein the determined score for the at least one user experience parameter is obtained from the steps of:
      receiving response time of one or more end user devices;
      receiving user inputs for setting threshold response time;
      comparing the monitored response time with the threshold response time;
      determining a wow-count and a woe-count based on the comparison, wherein the woe-count indicates a number of times the monitored response time exceeds the threshold response time and the wow-count indicates the number of times the monitored response is less than the threshold response time; and
      determining a ratio for wow-counts to a total count, wherein the total count is the sum of wow-count and woe-count;
   wherein the determined score for the at least one network anomaly parameter is obtained from the steps of:
      identifying one or more network anomalies occurring in the network;
      receiving number of transactions affected by the one or more network anomalies; and
      determining a percentage of number of transactions affected by the anomalies to the total number of transactions; and
   wherein the determined score is used to prevent potential disruptions in the IT environment by real time detection and resolution of exceptional events.

2. The method of claim 1, wherein said network nodes comprise one or more end user devices, servers, or a combination thereof.

3. The method of claim 1, wherein the at least one resource performance parameter comprises:
   one or more processor performance parameters selected from total processor utilization, total deferred procedure call (DPC) time, total interrupt time, total privileged time, context switches per second, processor queue length per processor, total user time, or total idle time;
   one or more memory performance parameters selected from memory used, free system page table entries (PTE), pages input per second, pages per second, available megabytes of memory, pool paged bytes, or pool non-paged bytes;
   one or more disk performance parameters selected from average disk transfer rate, disk read time, current disk queue length, idle time, percentage disk write time, disk reads/sec, disk writes/sec, average disk bytes/read, average disk bytes/transfer, average disk bytes/write, average disk sec/read, average disk sec/write, disk bytes/sec, disk read bytes/sec, disk transfers/sec, disk write bytes/sec, split IO/sec, or percentage disk time;
   one or more database performance parameters selected from buffer cache hit ratio (%), average wait time, page life expectancy in seconds, stolen server memory (%), thread count, processor time (%), total server memory, buffer hit ratio (%), cache hit ratio (%), data dictionary hit ratio (%), FRA Usage (%), or library cache miss ratio (%); or
   one or more network performance parameters selected from output queue length, network utilization analysis, bytes received/sec, bytes sent/sec, bytes total/sec, packets received/sec, packets sent/sec, or packets/sec.

4. The method of claim 3, wherein the determined score for the at least one resource performance parameter is obtained from the steps of:
   receiving data for at least one parameter related to resource performance in the network; and
   determining score for one or more resource performance parameters, wherein the score is a percentage of the value of the parameter to the total value of the parameter.

5. A system comprising:
   one or more processing units;
   a memory unit coupled to the one or more processing units, wherein the memory unit comprises:
   a data reception module configured to receive data related to a plurality of parameters associated with network nodes implementing a web application, the plurality of parameters comprising at least one parameter for each of exceptions, network anomalies, resource performance, and user experience;
   a score computation module configured to determine scores associated with the one or more parameters, wherein the score represents a measurable value relative to a predefined score of the parameter associated with each network node;

one or more rating modules configured to: assign a rating for each of the plurality of parameters by comparing determined scores in a multiple rating scale, wherein the multiple rating scale comprises a plurality of threshold levels for each parameter, the threshold levels corresponding to predetermined range of scores; and
determine a final rating for each of the exceptions, network anomalies, resource performance, and user experience from parameter ratings; and
an application health module configured to automatically generate a score card indicative of health of the web application at near real-time based on the final ratings, wherein generating the score card comprises applying a weight factor for each of the final rating for exceptions, the network anomalies, the resource performance, and the user experience index;
wherein the determined score for the at least one exception parameter is obtained from the steps of:
  receiving information related to exceptions encountered at the network nodes;
  identifying, from exceptions encountered at the network nodes, repetitive network exceptions, unique network exceptions, or both associated with the web application;
  determining a number for lines of code for the unique exceptions, and a number for transactions for the repetitive exceptions; and
  determining a ratio of the determined number to total number to obtain the score;
wherein the determined score for the at least one user experience parameter is obtained from the steps of:
  receiving response time of one or more end user devices;
  receiving user inputs for setting threshold response time;
  comparing the monitored response time with the threshold response time;
  determining a wow-count and a woe-count based on the comparison, wherein the woe-count indicates a number of times the monitored response time exceeds the threshold response time and the wow-count indicates the number of times the monitored response is less than the threshold response time; and
  determining a ratio for wow-counts to a total count, wherein the total count is the sum of wow-count and woe-count;
wherein the determined score for the at least one network anomaly parameter is obtained from the steps of:
  identifying one or more network anomalies occurring in the network;
  receiving number of transactions affected by the one or more network anomalies; and
  determining a percentage of number of transactions affected by the anomalies to the total number of transactions; and
wherein the determined score is used to prevent potential disruptions in the IT environment by real time detection and resolution of exceptional events.

6. The system of claim 5, wherein the one or more devices comprise one or more of web servers, application servers, database servers, and databases.

7. The system of claim 5, further comprising a network interface configured to enable communication with the one or more devices over the network.

8. The system of claim 5, further comprising a user interface to enable a user to interact with the system.

* * * * *